United States Patent [19]

Arnold

[11] Patent Number: 4,575,923
[45] Date of Patent: Mar. 18, 1986

[54] METHOD OF MANUFACTURING A HIGH RESISTANCE LAYER HAVING A LOW TEMPERATURE COEFFICIENT OF RESISTANCE AND SEMICONDUCTOR DEVICE HAVING SUCH HIGH RESISTANCE LAYER

[75] Inventor: Emil Arnold, Chappaqua, N.Y.

[73] Assignee: North American Philips Corporation, New York, N.Y.

[21] Appl. No.: 482,671

[22] Filed: Apr. 6, 1983

[51] Int. Cl.[4] ............ H01L 21/263; H01L 7/00; H01L 21/26

[52] U.S. Cl. .................. 29/576 B; 148/1.5; 148/187; 357/57; 357/91; 420/578; 428/641

[58] Field of Search ......... 148/1.5, 187; 29/576 B; 357/91, 57, 59; 420/578; 428/641

[56] References Cited

U.S. PATENT DOCUMENTS

| | | | |
|---|---|---|---|
| 4,217,601 | 8/1980 | DeKeersmaeker et al. | 354/54 |
| 4,394,191 | 7/1983 | Wada et al. | 148/33.1 |
| 4,411,708 | 10/1983 | Winhan | 148/1.5 |
| 4,431,460 | 2/1984 | Barson et al. | 148/1.5 |
| 4,438,556 | 3/1984 | Komatsu et al. | 29/576 B |
| 4,467,519 | 8/1984 | Glang et al. | 29/576 B |
| 4,472,210 | 9/1984 | Wu et al. | 148/1.5 |

OTHER PUBLICATIONS

Lloyd et al., IBM-TDB, 23 (1980) 2811.

Primary Examiner—Upendra Roy
Attorney, Agent, or Firm—Paul R. Miller

[57] ABSTRACT

The present invention provides a high resistance film with a low temperature coefficient of resistance. Such films can be used as resistors in integrated and hybrid circuits, as well as resistive layers in passivating circuits for high-voltage devices. In the latter circuits, the passivating layers shield the device from the detrimental influence of external or internal electric fields. The ability to obtain a low temperature coefficient of resistance enables obtaining a high sheet resistance without being influenced by changing temperatures.

11 Claims, 4 Drawing Figures

METHOD OF MANUFACTURING A HIGH RESISTANCE LAYER HAVING A LOW TEMPERATURE COEFFICIENT OF RESISTANCE AND SEMICONDUCTOR DEVICE HAVING SUCH HIGH RESISTANCE LAYER

In electronic technology, a great need exists for thin films of high sheet resistivity, such as 10 Mohms/cm$^2$ or higher. Among applications for such films are resistors in integrated and hybrid circuits, as well as passivating layers for high-voltage devices and circuits that shield the device from the detrimental influence of external and internal electric fields.

BACKGROUND OF THE INVENTION

An important requirement for such resistors and resistive films is that a low temperature coefficient of resistance (TCR) be provided. This requirement becomes increasingly difficult to achieve in practice as the sheet resistivity increases. A further requirement for use in integrated circuits (IC) is compatibility with standard semiconductor process technology. The present invention achieves high resistance films of controllable resistivity (10 Mohm/cm$^2$ to 10$^6$ Mohm/cm$^2$) with a low temperature coefficient of resistance. Such films are compatible with IC technology.

In the prior art, semi-insulating films have been prepared with high sheet resistance, but also having a high temperature coefficient of resistance. Typically, such devices have a high negative TCR of $-70,000$ parts per million. The preparation of high resistivity films may be by a low pressure chemical vapor deposition technique wherein a mixture of silane (SiH$_4$) and nitrous oxide (N$_2$O) is allowed to react in a heated and partially evacuated chamber to deposit a thin film of material over the surface of a substrate. Typical deposition conditions are: temperature 650° C., pressure 0.5 Torr, and SiH$_4$/N$_2$O ratio 4:1. Such a film is subsequently annealed at about 900° C. This film consists of small silicon crystallites embedded in a silicon dioxide matrix, and will be referred to as the semi-insulating film.

SUMMARY OF THE INVENTION

According to the present invention, an ion implantation technique is carried out to implant arsenic or phosphorus ions in the film either before or after the above annealing step. This technique converts the semi-insulating material into a resistive film by modifying the electronic properties of the silicon crystallites, and enables a very low TCR.

Consequently, the presently claimed invention is directed to achieving high resistance films with low temperature coefficient of resistance values.

One embodiment of the present invention is to provide a method and the structure obtained for a high resistance film overlying a substrate structure. Such film is provided with a constant resistivity throughout the thickness of the thin film. Electrical contacts are provided by way of an electrode on the exterior surface of the thin film and an electrode of a conductive region between the thin film and the substrate.

A further embodiment of the present invention involves the formation of a layer of resistive material only at the surface of a thin semi-insulating film which may be provided on a substrate. Electrodes are provided only on the exterior surface of the thin film to provide a lateral current flow.

BRIEF DESCRIPTION OF THE DRAWINGS

The structure and technique of the presently claimed invention may be more clearly seen by reference to the drawing figures which illustrate without limitation several embodiments of the present invention, and wherein

FIG. 3 illustrates the implant profile for the arrangement of FIG. 2a.

DESCRIPTION OF PREFERRED EMBODIMENT

Figure 1:
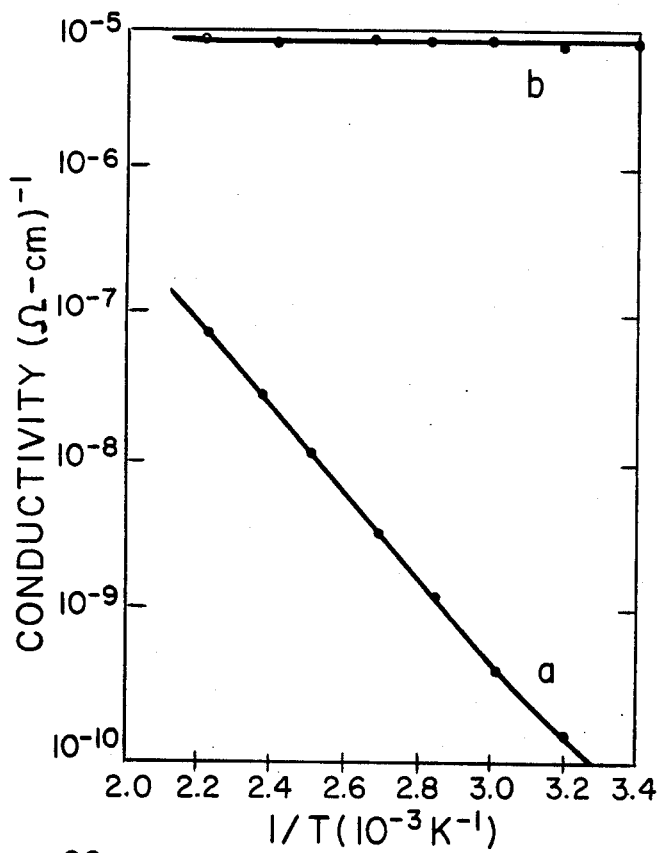
FIG. 1 illustrates a graph comparing an implanted structure, according to the present invention, with the prior art.

FIG. 1 shows the experimental conductivity versus reciprocal temperature for an unimplanted film (a) and an implanted film (b) having a doping, for example, of $4 \times 10^{19}$ arsenic ions per cm$^3$. It may be easily seen from this graph that the implanted film in curve (b) having $4 \times 10^{19}$ arsenic ions per cm$^3$ provides a material with a higher conductivity (the reciprocal of resistivity) with the conductivity being esentially constant with temperature. On the other hand, the undoped or non-implanted film in curve (a) shows a substantial change in conductivity with temperature for such structures.

The implanted thin film of the present invention was prepared by low pressure chemical vapor deposition in which a mixture of silane and nitrous oxide is allowed to react in a heated and partially evacuated chamber to deposit the semi-insulating thin film of material over the surface of a substrate. This reaction was carried out under temperature conditions of 650° C., a reduced pressure of 0.5 Torr and a ratio of silane to nitrous oxide of 4:1.

An ion implantation with either arsenic or phosphorus ions is carried out. This can be carried out either before or after a first annealing step, but annealing must also be performed after implantation if there is a first annealing step before ion implantation.

The final properties of the thin film depend on the implantation dose. For example, to achieve a uniform resistivity over the thickness of the film, such as shown in FIG. 3 representing the structure of FIG. 2a, several implantations are made at different energies. Thus, ion implantations may be carried out at $2 \times 10^{14}$ arsenic ions per cm$^2$ at 145 KeV, $1 \times 10^{14}$ arsenic ions per cm$^2$ at 70 KeV, and $6 \times 10^{13}$ arsenic ions per cm$^2$ at 25 KeV. This produces a nearly uniform arsenic concentration of $4 \times 10^{19}$ per cubic centimeter in a thin film of 1,000 Angstrom thickness. Such an implantation concentration is illustrated in FIG. 3. After forming the first implanted region, the structure is annealed at approximately 900° C., for example.

If uniform resistivity throughout the thickness of the film is not required, a single low-energy ion implantation into a semi-insulating film will produce a thin layer of resistive material near the surface of the film. Such a resistive layer over the film is shown in FIG. 2b, for example. In this structure, a single ion implantation is carried out at $10^{14}$ arsenic ions per cm$^2$ at 25 KeV.

Figure 2A:
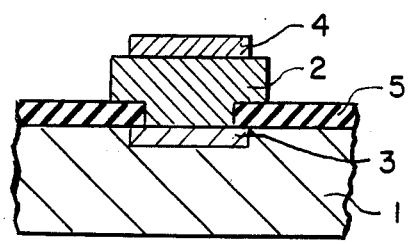
FIGS. 2a and 2b illustrate respective different arrangements for the implanted structure of the present invention.
Figure 2B:
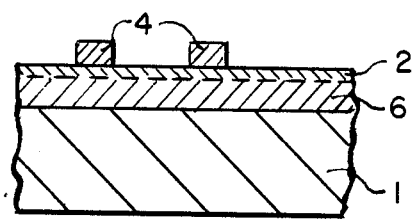
Figure 3:
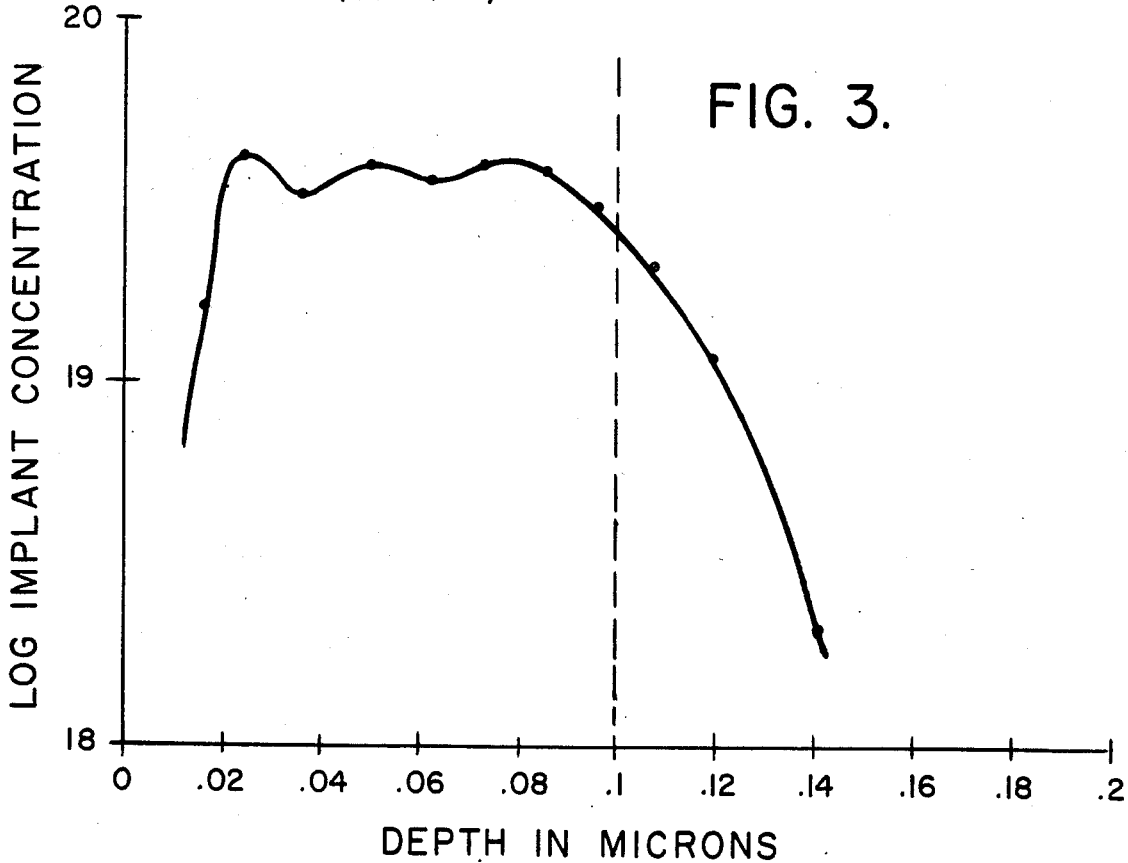

These structures obtained may be provided in two different geometries as shown in FIGS. 2a and 2b. In FIG. 2a, an implanted resistive film 2 constituting the entire thin film is formed on a silicon substrate 1. A conductive region 3 of a doped silicon wafer provides one electrode at one side of the resistive film 2, while a metal electrode 4 is formed at an opposite side of the resistive film 2. An insulator 5, such as a layer of silicon dioxide, is provided on the surface of the silicon substrate 1 to mask the implanted resistive film 2 from the silicon substrate 1.

In a preferred embodiment of this structure, for example, the silicon substrate 1 can be a p-type Si wafer or a p-type portion of a larger silicon integrated circuit. The conductive region 3 could then be formed by diffusion or implantation in excess of $1 \times 10^{20}$ arsenic or phosphorous atoms per cm$^3$.

In the arrangement of FIG. 2a, a vertical current flow from the top to the bottom electrical contact is achieved. The implanted resistive film 2 has a nearly uniform resistance throughout the film thickness as seen in FIG. 3, which may be achieved, as noted above, by several ion implantations at different energies.

In FIG. 2b, a semi-insulating layer 6 is formed on a suitable substrate 1, such as quartz, ceramic or an oxidized silicon wafer, and an implanted resistive layer 2 is formed at the surface of the semi-insulating layer 6. This implanted resistive layer 2 can be achieved by a single ion implantation at a low energy value, such as $10^{14}$ arsenic ions per cm$^2$ at 25 KeV as discussed above. A thin layer of resistive material 2 is therefore formed at the surface of semi-insulating layer 6.

In this arrangement of FIG. 2b both electrical contacts are provided by metal electrodes 4, such as aluminum, at one side of the layer, i.e. along the implanted resistive layer 2, so that current flow is lateral. These metal electrodes 4, as well as those in FIG. 2a, may be provided by a vacuum deposition of aluminum, followed by photolithographic delineation of the contact area. The contacts are then alloyed at 450°–500° C. in a gas atmosphere, such as hydrogen, nitrogen, or a mixture, to assume good electrical contact between the metal and the resistive film.

While several embodiments of the present invention have been illustrated and described, the present invention includes all variations and features which may be evident from the claims.

What I claim is:

1. Method of manufacturing a solid state device having a high resistivity film with a low temperature coefficient of resistance comprising the steps of forming a thin semi-insulating film, said film consisting of small silicon crystallites embedded in a silicon dioxide matrix, carrying out ion implantation of said film by one of arsenic or phosphorus ions to produce a resistive layer having a low temperature coefficient of resistance, forming electrode regions with respect to said film, and annealing said film at approximately 900° C.

2. A method according to claim 1, wherein said resistive layer is produced throughout the thickness of said thin film.

3. A method according to claim 1, wherein said resistive layer is produced as a single layer formed into one surface of said thin film.

4. A method according to claim 2, wherein said ion implantation is carried out by a three-stage ion implantation technique to achieve uniform resistance throughout the thickness of said film.

5. A method according to claim 2, wherein said electrode regions are formed on opposite sides of said thin film.

6. A method according to claim 2, wherein said thin film is formed on a silicon substrate, one of said electrode regions is formed of a doped region between said thin film and said silicon substrate, and another electrode region is formed as a metal layer on said thin film opposite to said doped region.

7. A method according to claim 3, wherein said thin film is formed on a substate with said resistive layer being at said one surface opposite to said substrate.

8. A method according to claim 3, wherein a single ion implantation is carried out with arsenic ions at $10^{14}$ ions per cm$^2$ at 25 KeV.

9. A method according to claim 4, wherein said film has a thickness of about 1000A.

10. A method according to claim 4, wherein said ion implantation is of arsenic ions, and wherein said three-step ion implantation technique includes implantation of arsenic ions at $2 \times 10^{14}$ ions per cm$^2$ at 145 KeV, $1 \times 10^{14}$ ions per cm$^2$ at 70 KeV, and $6 \times 10^{13}$ ions per cm$^2$ at 25 KeV.

11. A method according to claim 7, wherein said electrode regions are formed at said one surface opposite to said substrate.

* * * * *